United States Patent
Li

(10) Patent No.: US 7,351,999 B2
(45) Date of Patent: Apr. 1, 2008

(54) ORGANIC LIGHT-EMITTING DEVICE WITH IMPROVED LAYER STRUCTURE

(75) Inventor: Shi-Hao Li, Banciao (TW)

(73) Assignee: AU Optronics Corporation, Hsinchu (TW)

( * ) Notice: Subject to any disclaimer, the term of this patent is extended or adjusted under 35 U.S.C. 154(b) by 55 days.

(21) Appl. No.: 11/014,508

(22) Filed: Dec. 16, 2004

(65) Prior Publication Data

US 2006/0131562 A1 Jun. 22, 2006

(51) Int. Cl.
- *H01L 51/50* (2006.01)
- *H01L 51/54* (2006.01)
- *H01J 1/62* (2006.01)
- *C09K 11/06* (2006.01)

(52) U.S. Cl. .................. 257/40; 257/103; 257/E51.018; 257/E51.022; 438/82; 438/99; 313/504; 428/690

(58) Field of Classification Search .................. 257/40, 257/103, E51.018, E51.022; 438/82, 99, 438/690; 313/499–509

See application file for complete search history.

(56) References Cited

U.S. PATENT DOCUMENTS

| | | | |
|---|---|---|---|
| 5,077,142 A * | 12/1991 | Sakon et al. ............... | 428/690 |
| 5,335,308 A | 8/1994 | Sorensen ................... | 392/412 |
| 5,759,444 A | 6/1998 | Enokida et al. ........ | 252/301.16 |
| 5,776,623 A | 7/1998 | Hung et al. ................. | 428/690 |
| 5,853,905 A * | 12/1998 | So et al. ...................... | 428/690 |
| 5,925,980 A * | 7/1999 | So et al. ...................... | 313/504 |
| 5,935,721 A | 8/1999 | Shi et al. ..................... | 428/690 |
| 5,955,834 A | 9/1999 | Epstein et al. .............. | 313/501 |
| 6,013,384 A | 1/2000 | Kido et al. .................. | 428/690 |
| 6,130,001 A * | 10/2000 | Shi et al. ..................... | 428/690 |
| 6,361,886 B2 | 3/2002 | Shi et al. ..................... | 428/690 |
| 6,423,429 B2 * | 7/2002 | Kido et al. .................. | 428/690 |
| 6,465,115 B2 * | 10/2002 | Shi et al. ..................... | 428/690 |
| 6,475,648 B1 * | 11/2002 | Hatwar et al. .............. | 428/690 |
| 6,565,996 B2 * | 5/2003 | Hatwar et al. .............. | 428/690 |
| 6,579,629 B1 | 6/2003 | Raychaudhuri et al. ..... | 428/690 |
| 6,582,837 B1 * | 6/2003 | Toguchi et al. ............. | 428/690 |
| 6,603,140 B2 | 8/2003 | Kobori et al. ................ | 257/40 |
| 6,872,472 B2 * | 3/2005 | Liao et al. ................... | 428/690 |
| 6,929,872 B2 * | 8/2005 | Mori et al. .................. | 428/690 |

(Continued)

FOREIGN PATENT DOCUMENTS

JP 2001-196179 7/2001

OTHER PUBLICATIONS

Pope, et al. J. Chem. Phys. 38 (1963): 2042-2043.*

(Continued)

*Primary Examiner*—B. William Baumeister
*Assistant Examiner*—Matthew W. Such
(74) *Attorney, Agent, or Firm*—Ware, Fressola, Van Der Sluys & Adolphson, LLP

(57) ABSTRACT

An organic light emitting device having a cathode, an anode and an organic layer structure disposed between the cathode and the anode, the organic layer structure comprising a hole injection layer doped with a p-type dopant, a hole transport layer, an emissive layer and an electron transport layer doped with an n-type dopant, wherein all of the layers in the organic layer structure are substantially made from the same organic host material. In particular, the organic host material is a bipolar organic material such as a derivative of fused aromatic rings. The emissive layer can be doped with a fluorescent dye or a phosphorescent dye.

5 Claims, 10 Drawing Sheets

U.S. PATENT DOCUMENTS

| | | | |
|---|---|---|---|
| 6,991,859 B2 * | 1/2006 | Klubek et al. | 428/690 |
| 7,061,011 B2 * | 6/2006 | Forrest et al. | 257/40 |
| 7,151,007 B2 * | 12/2006 | Werner et al. | 438/99 |
| 2002/0038867 A1 | 4/2002 | Kobori et al. | 257/40 |
| 2002/0093283 A1 * | 7/2002 | Seo et al. | 313/504 |
| 2002/0109136 A1 * | 8/2002 | Seo et al. | 257/40 |
| 2003/0049489 A1 * | 3/2003 | Hatwar et al. | 428/690 |
| 2003/0072964 A1 * | 4/2003 | Kwong et al. | 428/690 |
| 2003/0087126 A1 * | 5/2003 | Ishida et al. | 428/690 |
| 2004/0018380 A1 * | 1/2004 | Aziz et al. | 428/690 |
| 2004/0018383 A1 * | 1/2004 | Aziz et al. | 428/690 |
| 2004/0032206 A1 | 2/2004 | Weaver et al. | 313/504 |
| 2004/0100188 A1 * | 5/2004 | Hosokawa et al. | 313/504 |
| 2004/0183066 A1 * | 9/2004 | Klubek et al. | 257/40 |
| 2004/0219386 A1 * | 11/2004 | Thoms | 428/690 |
| 2005/0112404 A1 * | 5/2005 | Hamada et al. | 428/690 |
| 2005/0151466 A1 * | 7/2005 | Liao et al. | 313/504 |
| 2005/0173700 A1 * | 8/2005 | Liao et al. | 257/40 |
| 2005/0238910 A1 * | 10/2005 | Ionkin et al. | 428/690 |
| 2006/0003184 A1 * | 1/2006 | Hatwar et al. | 428/690 |
| 2006/0036114 A1 * | 2/2006 | Wang et al. | 568/1 |
| 2007/0106103 A1 * | 5/2007 | Ikeda et al. | 585/26 |

OTHER PUBLICATIONS

Lee, et al. Appl. Phys. Lett. 85 (2004): 3301-3303.*
Shi, et al. Appl. Phys. Lett. 80 (2002): 3201-3203.*
Baldo, M. A., et al. "High-Efficiency Fluorescent Organic Light-Emitting Devices Using a Phosphorescent Sensitizer." NATURE. vol. 403 (2000): 750-752.*
Helfrich, W. and Schneider, W. G. "Recombination Radiation in Anthracene Crystals." Phys. Rev. Lett. vol. 14, No. 7 (Feb. 15, 1965): pp. 229-231.*

* cited by examiner

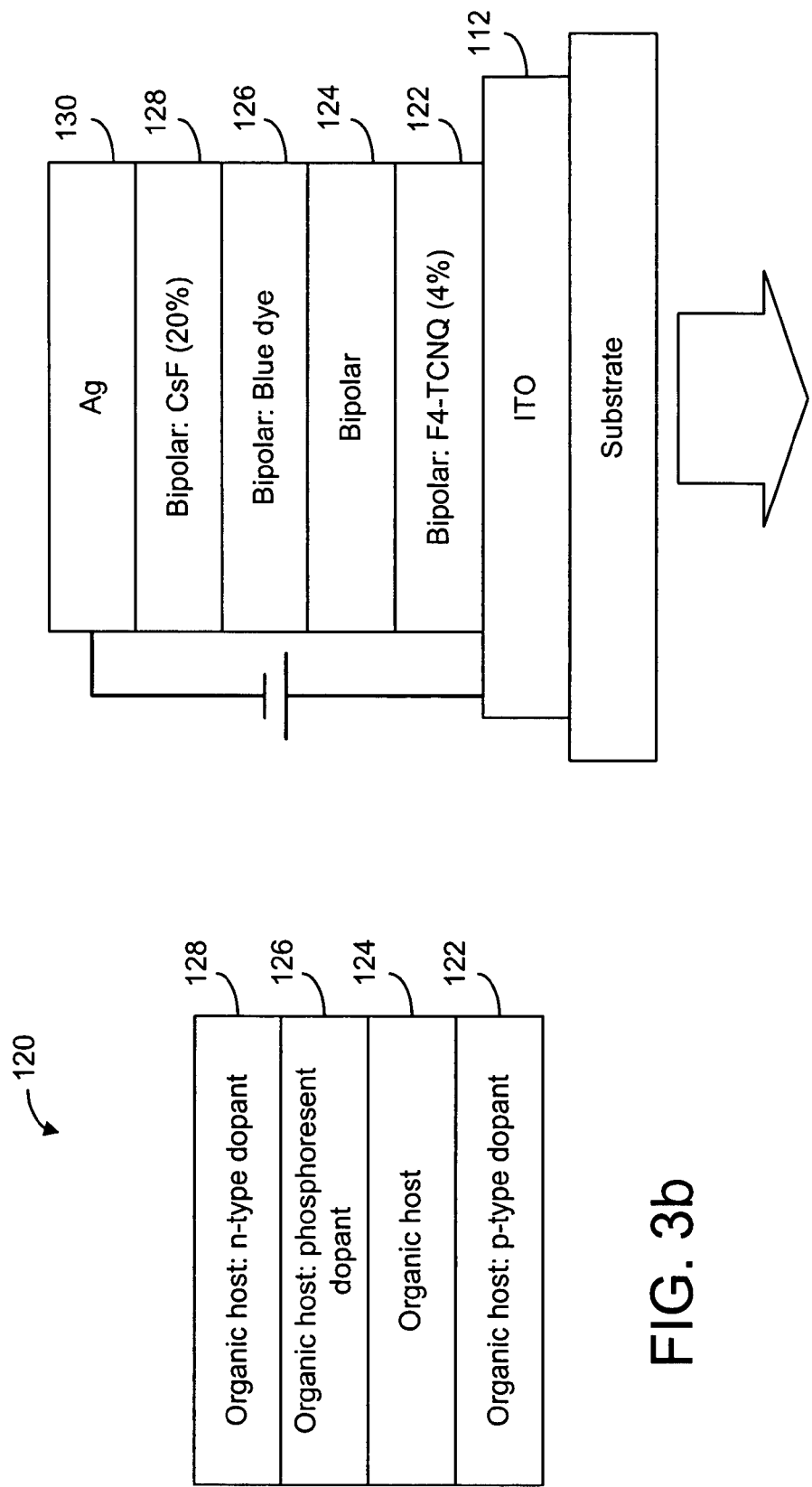

ORGANIC LIGHT-EMITTING DEVICE WITH IMPROVED LAYER STRUCTURE

FIELD OF THE INVENTION

The present invention relates generally to light-emitting devices and, more particularly, to organic light-emitting diodes.

BACKGROUND OF THE INVENTION

Organic light-emitting diodes OLEDs are known in the art. For example, Kido et al. (U.S. Pat. No. 6,013,384) discloses, as shown in FIG. 1a, an organic electroluminescent device 10 wherein the organic layers consist of a hole transport layer (HTL) 13, an emissive layer 14 and a metal-doped organic compound layer 15 disposed between an anode layer 12 and a cathode layer 16. The device is fabricated on a substrate 11. According to Kido et al., the organic compounds which can be used in the formation of the emissive layer, the electron transport layer and the metal-doped layer in the OLED device, include polycyclic compounds, condensed polycyclic hydrocarbon compounds, condensed heterocyclic compounds, etc. The dopant in the metal-doped organic compound layer is a metal having a work function of less than or equal to 4.2 eV. The emissive layer can be made of 8-tris-hydroxyquinoline aluminum ($Alq_3$) among many metal-chelated complex compounds, for example. The hole transport layer 13, as well as a hole injection layer, can be made of an arylamine compound. The anode layer 12 is made of ITO and the cathode 16 is an aluminum layer.

Weaver et al. (U.S. Publication No. 2004/0032206 A1) discloses another OLED including an alkali metal compound layer. As shown in FIG. 1b, the OLED 20 is fabricated on a plastic substrate 21 pre-coated with an ITO anode 22. The cathode consists of two layers: a metal oxide layer 28 deposited over a layer 27 of Mg or Mg alloy. The alkali metal compound layer 26 can be made of alkali halides or alkali oxides such as LiF and $Li_2O$. The organic layers include an HTL layer 23, an emissive layer (EML) 24 and an electron transport layer (ETL) 25. In particular, a layer of copper-phthalocyanine (CuPc) is deposited to a thickness of about 10 nm thick over the ITO anode 22 to improve hole injection and device lifetime. The HTL 23 of 4,4'-[N-(1-naphthyl)-N-phenyl-amino]biphenyl (NPB) is deposited to a thickness of about 30 nm over the CuPc. The EML 24 of 4,4'-N,N'-dicarbazole-biphenyl (CBP) doped with fac-tris(2-phenylpyridine-)-iridium ($Ir(ppy)_3$) is deposited to a thickness of 30 nm over the NPB. A hole blocking layer of aluminum(III)bis(2-methyl-8-quinolinato)4-phenylphenolate (BAlq) is deposited to a thickness of about 10 nm over the EML. The ETL 25 of $Alq_3$ is deposited to a thickness of about 40 μm over the BAlq. The layer 26 of LiF about 0.5-1 nm thick is deposited after the $Alq_3$ and before the Mg alloy (including Mg:Ag).

Raychaudhuri et al. (U.S. Pat. No. 6,579,629 B1) discloses an OLED 30 (see FIG. 1c) wherein the anode 32 is made from ITO disposed on a substrate 31; the HIL 33 is made from a fluorinated polymer $CF_x$, where x is 1 or 2; the HTL 34 is made from an aromatic tertiary amine such as NPB; the EML 35 is made from $Alq_3$:C545T, with C545T being 1H,5H,11H-[1]Benzopyrano[6,7,8-ij]quinolizin-11-one, 10-(2-benzothiazolyl)-2,3,6,7-tetrahydro-1,1,7,7-tetramethyl-(9CI); the ETL 36 is made from $Alq_3$, the buffer structure comprises a first buffer layer 37 made from LiF, and a second buffer layer 38 made from CuPc; and the cathode is made from Al:Li (3 w %).

Hung et al. (U.S. Pat. No. 5,776,623) discloses an electroluminescent device 40 (see FIG. 1d) wherein the HIL 43 is a 15 nm-thick CuPc layer deposited over the anode layer 42 on top of a substrate 41; the HTL 44 is a 60 nm-thick NPB layer; the ETL 45 is a 75 nm-thick $Alq_3$ layer. The buffer layer 46 is a 0.5 nm-thick lithium fluoride (LiF) layer. The lithium fluoride layer can be replaced by magnesium fluoride ($MgF_2$), calcium fluoride ($CaF_2$), lithium oxide ($Li_2O$) or magnesium oxide (MgO). The cathode layer 48 can be made from aluminum and Mg:Ag. Ag and Au are also used in the cathode layer.

In the above-mentioned OLEDs, at least the EML and HTL are made from different materials. In Weaver et al., the ETL and the EML are also made from different materials. When the HIL, HTL, EML and ETL are made from different organic materials, it is required to have four different deposition channels to separately deposit the different organic materials in order to avoid cross contamination in the fabrication process. In the fabrication of a full-color organic display device, the deposition of the organic layers is complex and costly.

It is thus advantageous and desirable to provide a method for producing an organic light-emitting device wherein the number of different organic deposition channels can be reduced.

SUMMARY OF THE INVENTION

It is a primary objective of the present invention to provide an organic light-emitting diode (OLED) wherein the number of different materials, especially the host materials, used in the organic layers in such an OLED, is reduced. In order to achieve this objective, the present invention uses a bipolar organic material such as materials derived from fused aromatic rings as the host material at least for the emissive layer and the hole transport layer in an OLED. The OLED can be a phosphorescent OLED or a fluorescent OLED.

Thus, the first aspect of the present invention provides an organic light emitting device comprising:

a cathode;

an anode; and an organic layer structure disposed between the cathode and the anode, the organic layer comprising:

a hole transport layer disposed adjacent to the anode;

an electron transport layer disposed adjacent to the cathode; and an emissive layer disposed between the hole transport layer and the electron transport layer, wherein the hole transport layer, the emissive layer and the electron transport layer are made from substantially the same organic host material.

According to the present invention, the organic host material comprises a bipolar organic material, such as a derivative of fused aromatic rings, like a derivative of anthracene.

According to the present invention, the electron transport layer is made substantially from a bipolar organic material doped with at least one n-type dopant.

According to the present invention, the emissive layer is made substantially from a bipolar organic material doped with at least one fluorescent dopant or one phosphorescent dopant.

According to the present invention, the hole transport layer is doped with a p-type dopant.

According to the present invention, the organic layer structure further comprises a hole injection layer disposed between the hole transport layer and the anode, wherein the hole injection layer is made substantially from the same organic host material doped with at least one p-type dopant.

The second aspect of the present invention provides a method of improving a process for fabricating an organic light emitting device, the device comprising a cathode, an anode, and an organic layer structure disposed between the cathode and the anode, the organic layer structure comprising a hole transport layer disposed adjacent to the anode, an electron transport layer disposed adjacent to the cathode and an emissive layer disposed between the hole transport layer and the electron transport layer. The method comprises:

providing an organic host material for use in the hole transport layer, the emissive layer and the electron transport layer;

doping the electron transport layer with at least one n-type dopant; and doping the emissive layer with a luminescent dopant.

According to the present invention, the method further comprises the step of doping the hole transport layer with a p-type dopant.

According to the present invention, the hole transport layer comprises a hole injection layer disposed adjacent to the anode. The method further comprises:

doping the hole injection layer with at least one p-type dopant.

According to the present invention, the luminescent dopant comprises a fluorescent dopant or a phosphorescent dopant.

The third aspect of the present invention provides an organic layer structure for use in an organic light emitting device comprising a cathode and an anode, the organic layer structure disposed between the cathode and the anode. The organic layer comprises:

a hole transport layer disposed adjacent to the anode;

an electron transport layer disposed adjacent to the cathode; and an emissive layer disposed between the hole transport layer and the electron transport layer, wherein the hole transport layer, the emissive layer and the electron transport layer are made from substantially the same organic host material.

According to the present invention, the organic host material comprises a bipolar organic material, such as a derivative of fused aromatic rings.

According to the present invention, the electron transport layer is substantially made from a bipolar organic material doped with at least one n-type dopant; and the emissive layer is substantially made from a bipolar organic material doped with a fluorescent dopant or a phosphorescent dopant.

According to the present invention, the organic layer structure further comprises a hole injection layer disposed between the hole transport layer and the anode, wherein the hole injection layer is made substantially from the bipolar organic material doped with at least one p-type dopant.

The present invention will become apparent upon reading the description taken in conjunction with FIGS. 2 to 13.

BRIEF DESCRIPTION OF THE DRAWINGS

FIG. 3b is a schematic representation showing the organic layer structure in an OLED, according to the present invention, wherein the emissive layer contains a phosphorescent dopant.

FIG. 8 is a schematic representation showing an experimental sample of the organic OLED, according to the present invention.

DETAILED DESCRIPTION OF THE INVENTION

Figure 1B:
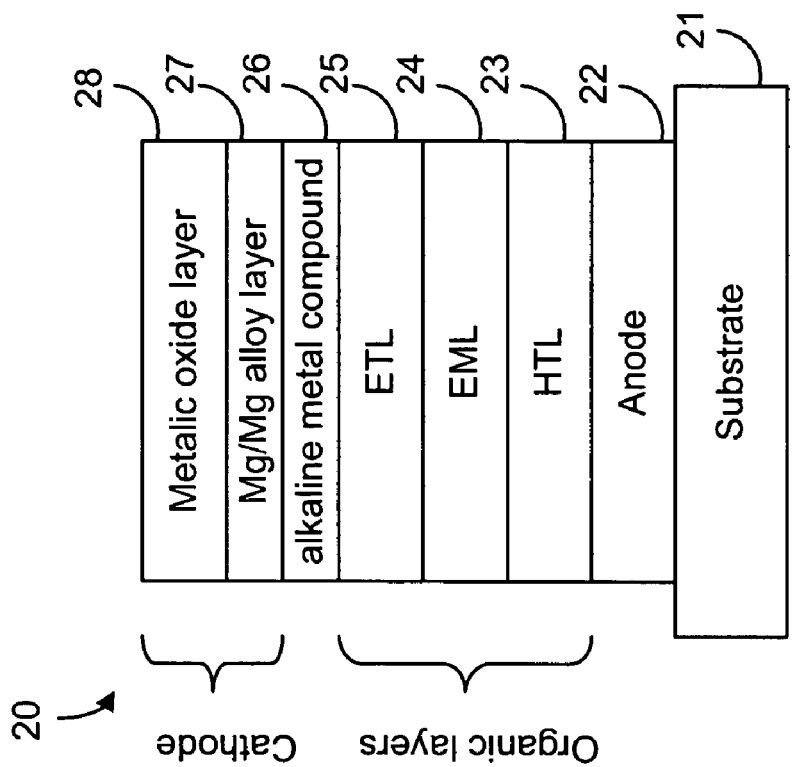
FIG. 1b is a schematic representation showing another prior art OLED.
Figure 1A:
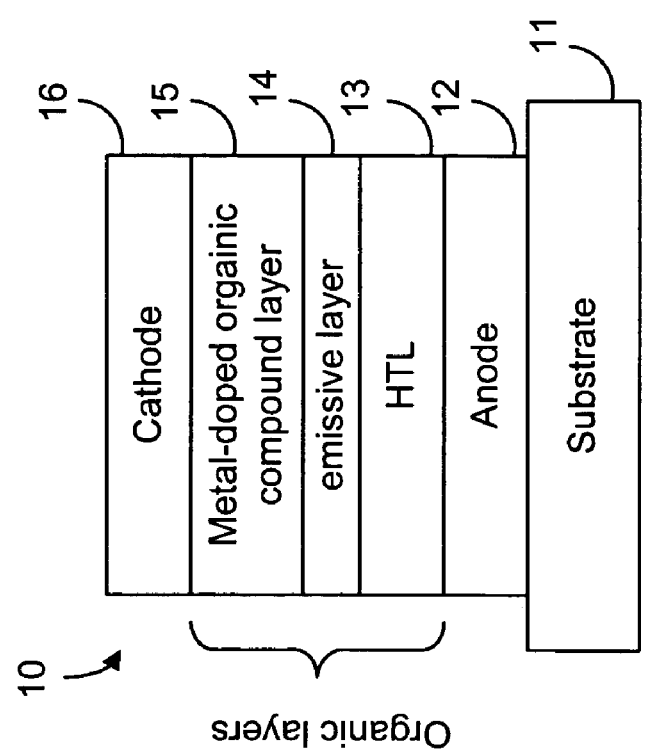
FIG. 1a is a schematic representation showing a prior art OLED.
Figure 1D:
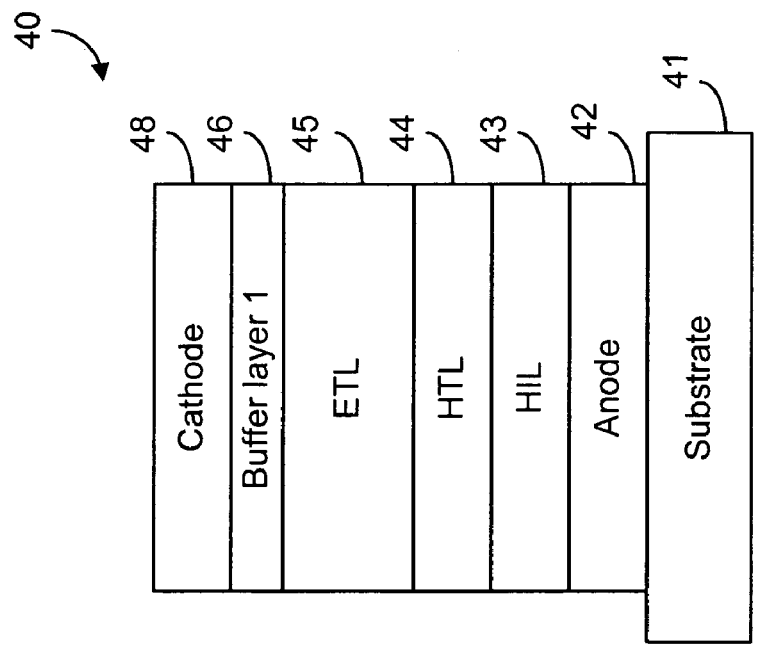
FIG. 1d is a schematic representation showing still another prior art OLED.
Figure 1C:
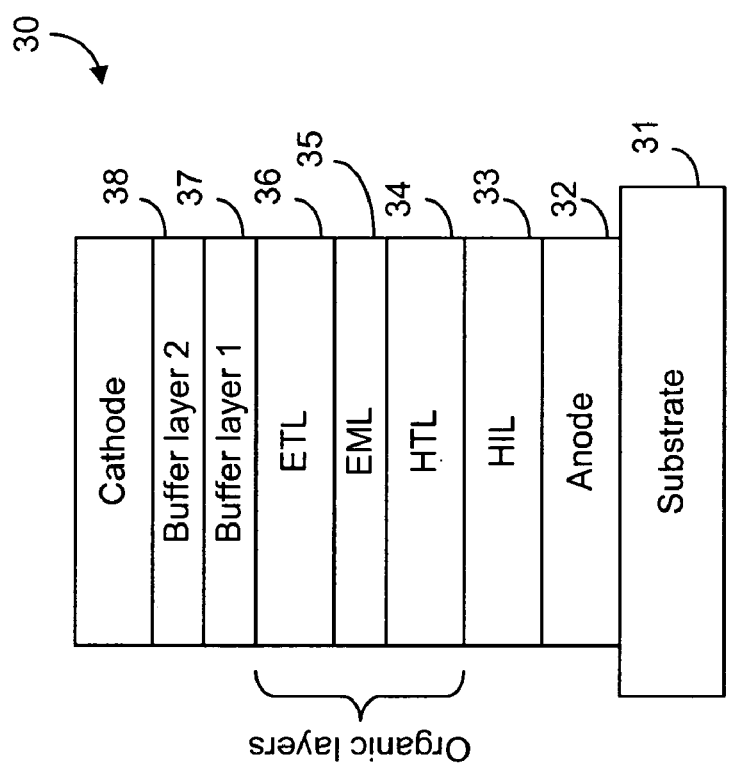
FIG. 1c is a schematic representation showing yet another prior art OLED.
Figure 3A:
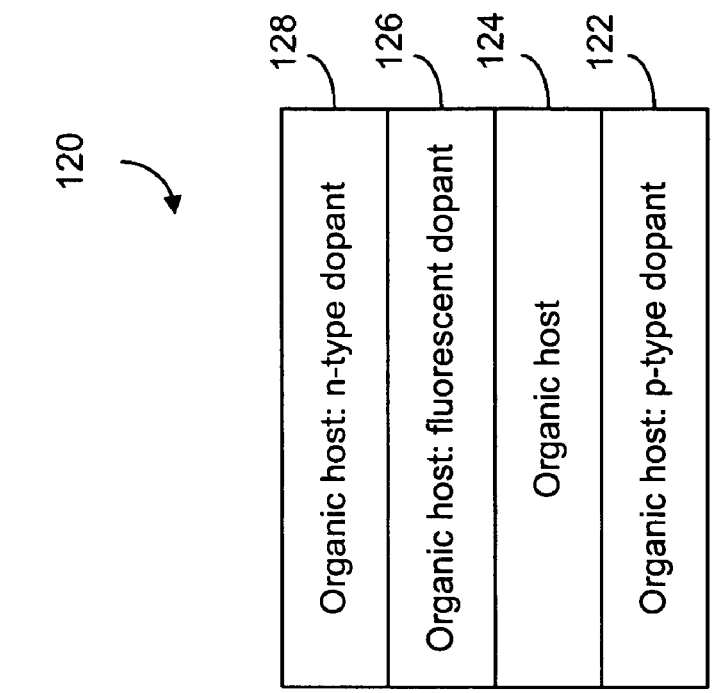
FIG. 3a is a schematic representation showing the organic layer structure in an OLED, according to the present invention, wherein the emissive layer contains a fluorescent dopant.
Figure 2:
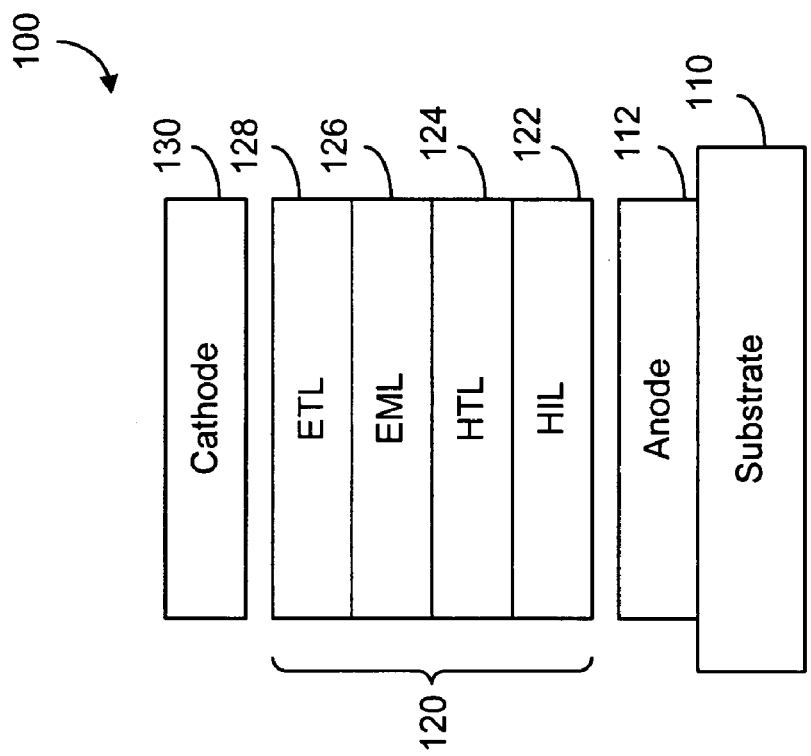
FIG. 2 is a schematic representation showing an example of OLED, according to the present invention.

The structure of the organic light-emitting device (OLED), according to the present invention, is shown in FIG. 2. In general, the OLED 100 comprises an organic layer structure 120 disposed between an anode layer 112 and a cathode layer 130. The anode layer 112 is disposed on a substrate 110. The organic layer structure 120 may comprise a hole injection layer (HIL) 122, a hole transport layer (HTL) 124, an emissive layer (EML) 126 and an electron transport layer (ETL) 128. The organic layer structure 120, according to the present invention, comprises an organic host material for use in the HIL 122, the HTL 124, the EML 126 and the ETL 128. As shown in FIGS. 3a and 3b, the organic host material in the HIL 122 is doped with a p-type dopant; the organic host material in the EML 126 is doped with a luminescent dopant or dye; and the organic host material in the ETL 128 is doped with an n-type dopant. The luminescent dopant in the EML 126 can be a fluorescent dopant (with singlet energy state, FIG. 3a) or a phosphorescent dopant (with triplet energy state, FIG. 3b).

It is preferable to use a bipolar organic material as the organic host material in the organic layer structure 120. The bipolar material can be used as both an electron transport medium and a hole transport medium. As such, the organic layer structure 120 can be divided into at least three sections: a hole transport section, an emissive section and an electron transport section.

Figure 6:
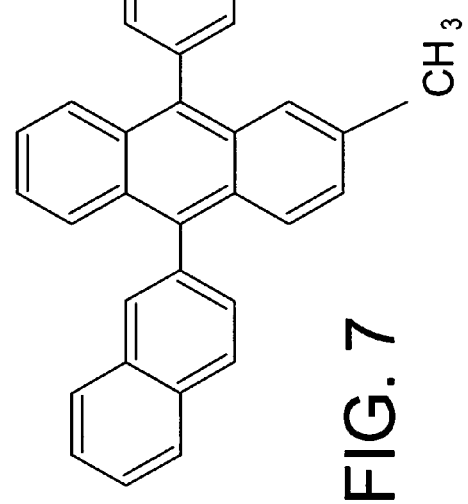
FIG. 6a shows benzene as an exemplary substituent on the fused aromatic ring material.
FIG. 6b shows toluene as an exemplary substituent on the fused aromatic ring material.
FIG. 6c shows naphthalene as an exemplary substituent on the fused aromatic ring material.
Figure 7:
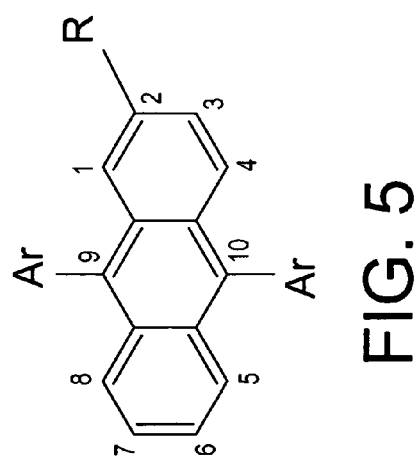
FIG. 7 shows an example of anthracene derivatives for use as the fused aromatic ring material in the organic layer, according to the present invention.
Figure 4:
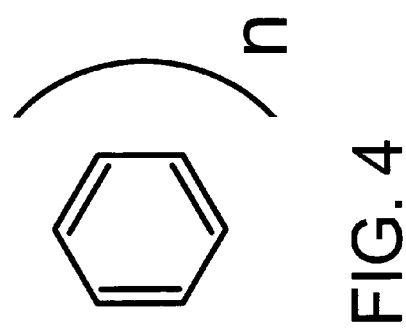
FIG. 4 is an example of the bipolar organic materials for use in the organic layer structure, according to the present invention.
Figure 5:
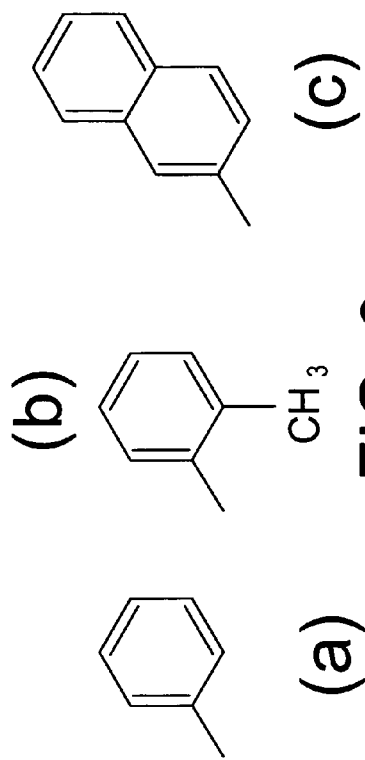
FIG. 5 shows the derivatives of anthracene as an example of the fused aromatic ring materials for use in the organic layer structure, according to the present invention.

An example of the bipolar organic materials is shown in FIG. 4. This bipolar organic material is a material derived from fused aromatic rings. For example, the fused aromatic ring material can be an anthracene. FIG. 5 shows an anthracene derivative with two symmetrically positioned substituents. In FIG. 5, R is any alkyl group and Ar is a substituent having one aromatic ring or more aromatic rings fused together. FIG. 6a shows benzene as an exemplary substituent having one aromatic ring. FIG. 6b shows toluene as an exemplary substituent having one aromatic ring. FIG. 6c shows naphthalene as an exemplary substituent having two fused aromatic rings. FIG. 7 shows an example of anthracene derivatives for use as the fused aromatic ring material in the organic layer 120 of the organic light emitting device 100, according to the present invention. In this example, the Ar substituents are naphthalene, and R is a methyl group.

The p-type dopant for use in the HIL 122 can be selected from F, Cl, Br and I or a compound containing one or more of F, Cl, Br and I. Other p-type dopants include: tetrafluoro-tetracyano-quinodimethane (F4-TCNQ), metallic oxides including ITO (indium-tin oxide), IZO (indium zinc oxide); semiconductor materials with a large band-gap (>3 eV) such as $TiO_2$, TiN; metals with work function greater than 4 eV. The dopant concentration ranges from 0.1 w % to 50 w %. Alternatively, the p-type dopant is used in both the HIL 122 and the HTL 124.

The n-type dopant for use in the ETL 128 can be selected from IA elements (alkali metals), IIA elements (alkaline earth metals) or a compound containing one or more of the IA, IIA elements. Other n-type dopants include: carbonic acid compounds, nitric acid compounds, acetic acid compounds and alkali metal-containing organic salts. The dopant concentration ranges from 0.1 w % to 50 w %.

In order to demonstrate the feasibility of using a single organic host material in different layers in the organic layer structure 120, an experimental sample has been fabricated, as shown in FIG. 8. In this experimental sample, the organic host material is TBADN(3-tert-butyl-9,10-di(naphtha-2-yl) anthracene (see FIG. 7); the ETL is 30 nm thick and doped with CsF (20 w %); the EML is 30 nm thick and doped with a blue dye; and the combined HTL and HIL layer is 10 nm thick and the dopant used in the HIL is F4-TCNQ (4 w %). The cathode is made of Ag and the anode is made of ITO. All the layers are deposited on a transparent substrate. The total thickness of the deposited layers is 110 nm.

Figure 9:
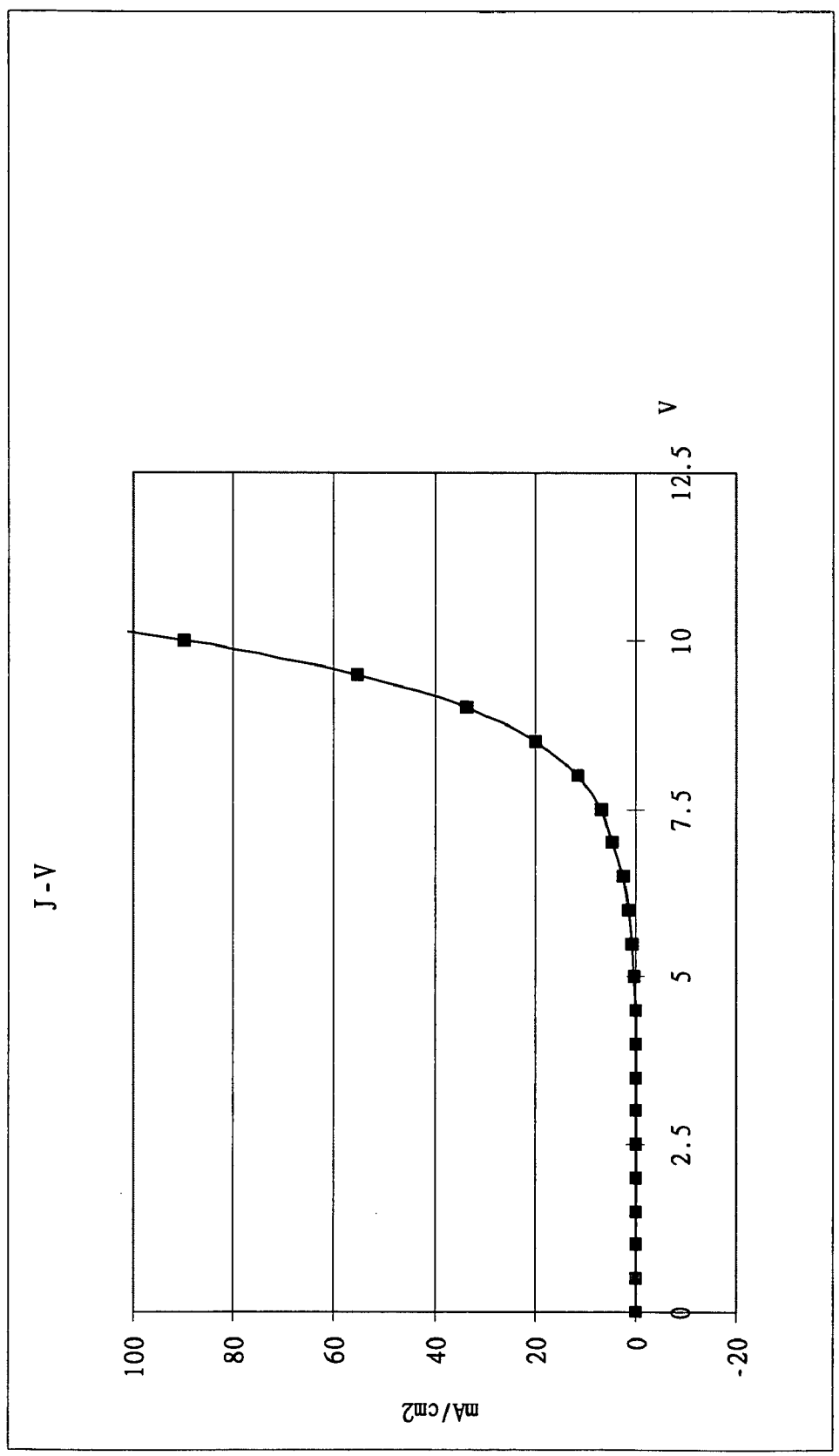
FIG. 9 is a plot of current density as a function of applied voltage.
Figure 10:
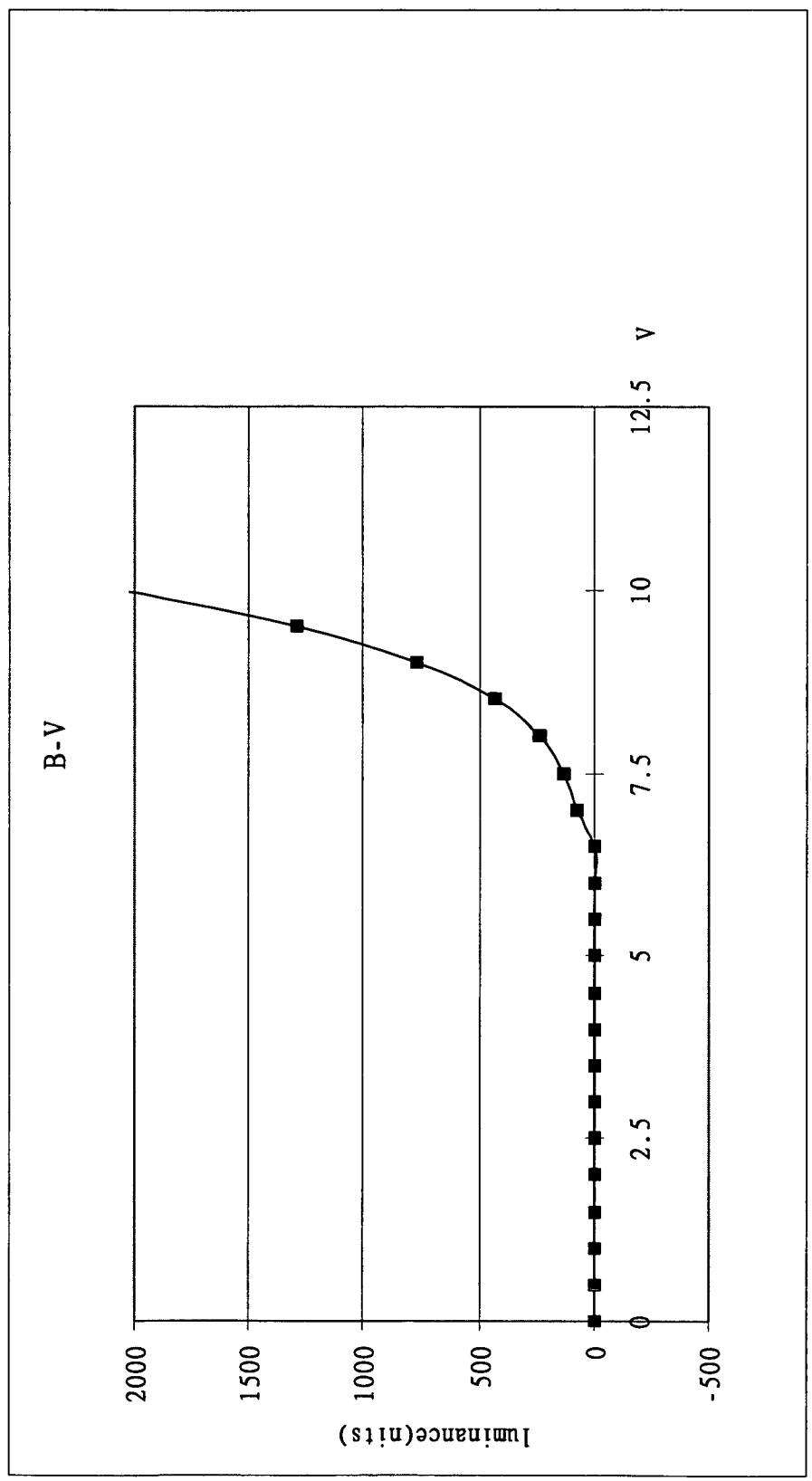
FIG. 10 is a plot of luminance as a function of applied voltage.
Figure 11:
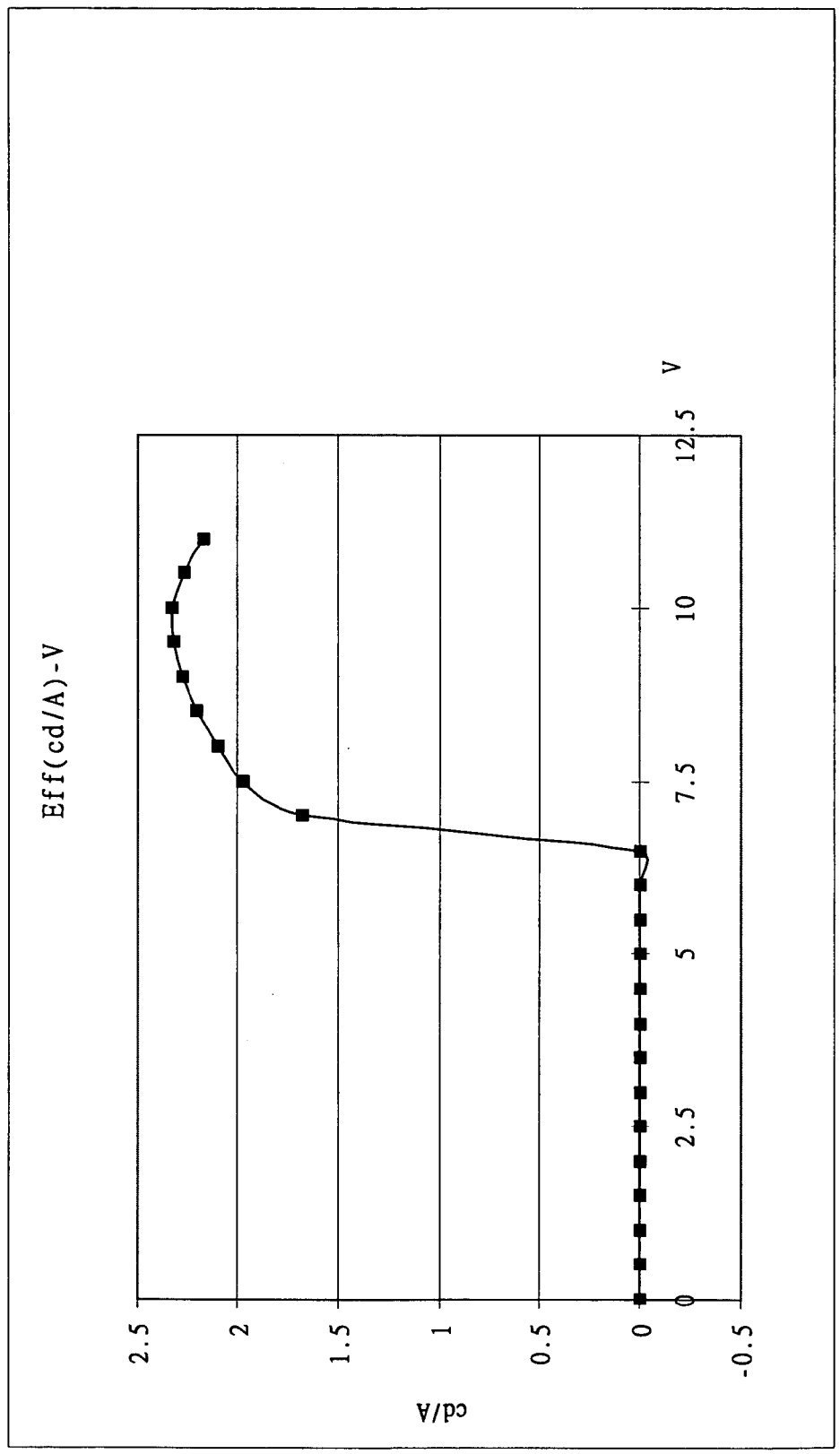
FIG. 11 is a plot of current efficiency as a function of applied voltage.
Figure 12:
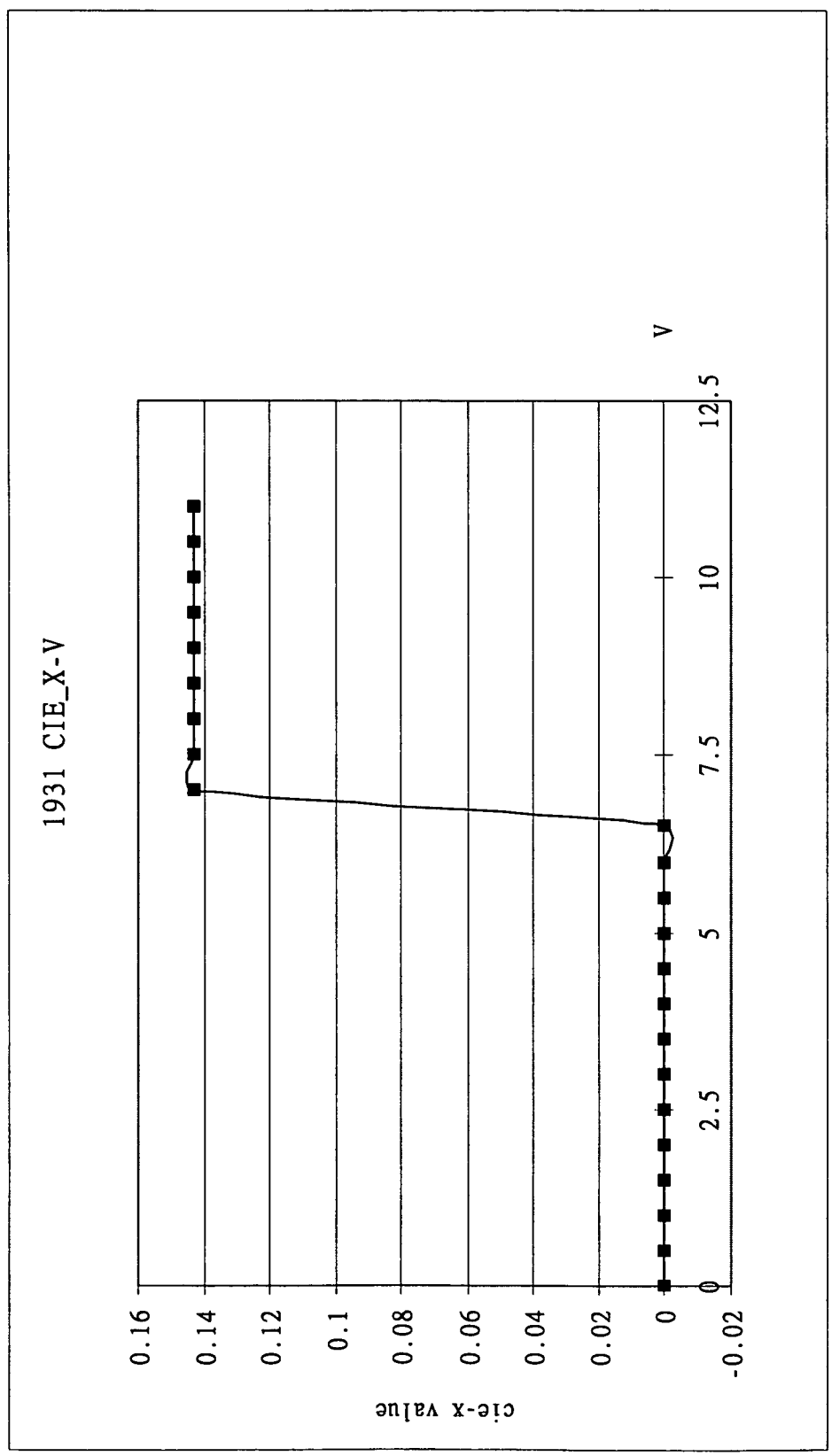
FIG. 12 is a plot of 1931 CIE chromaticity in x coordinate as a function of applied voltage.
Figure 13:
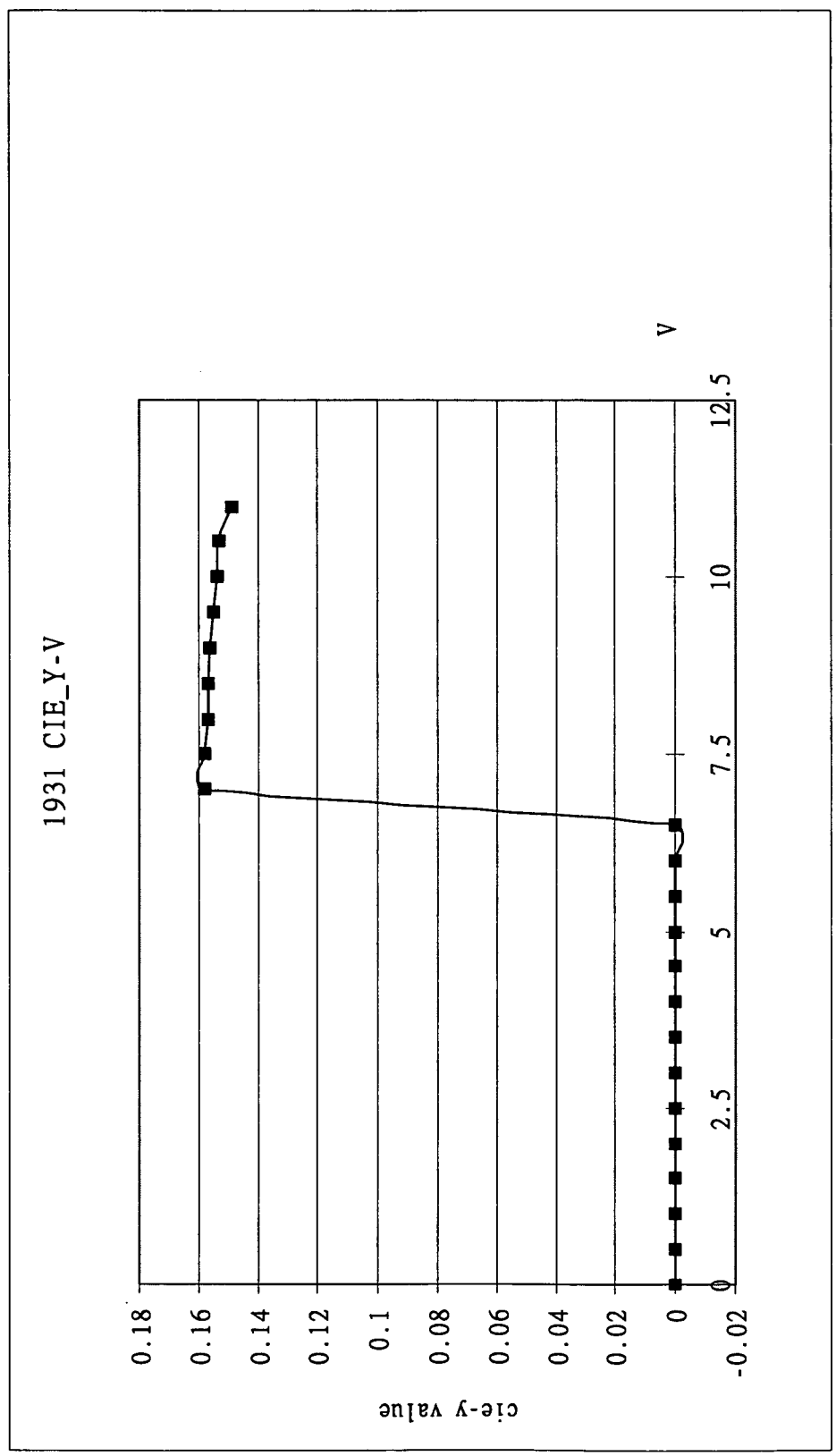
FIG. 13 is plot of 1931 CIE chromaticity in y coordinate as a function of applied voltage.

The performance of this experimental sample is shown in FIGS. 9 to 13. FIG. 9 is a plot of current density as a function of applied voltage. FIG. 10 is a plot of luminance as a function of applied voltage. FIG. 11 is a plot of current efficiency as a function of applied voltage. FIG. 12 is a plot of 1931 CIE chromaticity in x coordinate as a function of applied voltage. FIG. 13 is plot of 1931 CIE chromaticity in y coordinate as a function of applied voltage. At applied voltage =9V, the current density is equal to 33.57 $mA/cm^2$; the luminance is equal to 767 $cd/m^2$; the current efficiency is equal to 2.28 cd/A or 0.80 lm/W; 1931 $CIE_x$=0.143 and 1931 $CIE_y$=0.156.

In sum, the present invention provides an organic light emitting device comprising an organic layer structure disposed between a cathode layer and an anode layer. The organic layer structure comprises at least an electron transport layer, an emissive layer and a hole transport layer, wherein the host material in these layers is substantially the same. In particular, the host material is a bipolar organic material having the characteristics of being both as a hole transport medium and an electron transport medium. As such, it is not necessary to use different deposition channels to deposit the electron transport layer, the emissive layer and the hole transport layer.

Although the invention has been described with respect to one or more embodiments thereof, it will be understood by those skilled in the art that the foregoing and various other changes, omissions and deviations in the form and detail thereof may be made without departing from the scope of this invention.

What is claimed is:

1. An organic light emitting device comprising:
   a cathode;
   an anode; and
   an organic layer structure disposed between the cathode and the anode, the organic layer comprising:
   a hole transport layer disposed adjacent to the anode;
   an electron transport layer disposed adjacent to the cathode; and
   an emissive layer disposed between the hole transport layer and the electron transport layer, wherein the hole transport layer, the emissive layer and the electron transport layer are made from substantially the same organic host material, wherein the organic host material comprises a derivative of fused rings, and wherein all fused rings in the organic host material are benzene-based aromatic rings, wherein the organic layer structure further comprises a hole injection layer disposed between the hole transport layer and the anode and wherein the hole injection layer is made substantially from the same organic host material doped with at least one p-type dopant.

2. The organic light emitting device of claim 1 wherein the organic host material comprises a derivative of anthracene.

3. The organic light emitting device of claim 1 wherein the emissive layer is made substantially from a bipolar organic material doped with at least one fluorescent dopant.

4. The organic light emitting device of claim 1 wherein the emissive layer is made substantially from a bipolar organic material doped with at least one phosphorescent dopant.

5. The organic light emitting device of claim 1, wherein the organic host material is a bipolar organic material.

* * * * *